United States Patent
Rajski et al.

(10) Patent No.: US 11,150,299 B2
(45) Date of Patent: Oct. 19, 2021

(54) FLEXIBLE ISOMETRIC DECOMPRESSOR ARCHITECTURE FOR TEST COMPRESSION

(71) Applicant: Mentor Graphics Corporation, Wilsonville, OR (US)

(72) Inventors: Janusz Rajski, West Linn, OR (US); Yu Huang, West Linn, OR (US); Sylwester Milewski, Nowe Miasto Lubawskie (PL); Jerzy Tyszer, Poznan (PL)

(73) Assignee: Siemens Industry Software Inc., Plano, TX (US)

( * ) Notice: Subject to any disclaimer, the term of this patent is extended or adjusted under 35 U.S.C. 154(b) by 0 days.

(21) Appl. No.: 16/982,299

(22) PCT Filed: Mar. 21, 2019

(86) PCT No.: PCT/US2019/023279
§ 371 (c)(1),
(2) Date: Sep. 18, 2020

(87) PCT Pub. No.: WO2019/183297
PCT Pub. Date: Sep. 26, 2019

(65) Prior Publication Data
US 2021/0018563 A1 Jan. 21, 2021

Related U.S. Application Data

(60) Provisional application No. 62/646,497, filed on Mar. 22, 2018.

(51) Int. Cl.
*G01R 31/3185* (2006.01)
*G01R 31/3181* (2006.01)

(52) U.S. Cl.
CPC ........ *G01R 31/318547* (2013.01); *G01R 31/31813* (2013.01); *G01R 31/318536* (2013.01); *G01R 31/318555* (2013.01)

(58) Field of Classification Search
CPC ...... G01R 31/318547; G01R 31/31813; G01R 31/318536; G01R 31/318555
See application file for complete search history.

(56) References Cited

U.S. PATENT DOCUMENTS

| 8,468,404 | B1 | 6/2013 | Chickermane et al. |
| 2011/0320999 | A1 | 12/2011 | Rajski et al. |

(Continued)

OTHER PUBLICATIONS

Y. Huang, S. Milewski, J. Rajski, J. Tyszer and C. Wang, "Hypercompression of Test Patterns," 2018 IEEE International Test Conference (ITC), Phoenix, AZ, USA, 2018, pp. 1-9. (Year: 2018).*

(Continued)

*Primary Examiner* — Cynthia Britt

(57) ABSTRACT

A system for testing a circuit comprises scan chains, a controller, and hold-toggle circuitry. The hold-toggle circuitry is configured to allow, according to a control signal generated by the controller, some scan chains in the scan chains to operate in a full-toggle mode and some other scan chains in the scan chains to operate in a hold-toggle mode when a test pattern is being shifted into the scan chains. The control signal also contains information of a hold-toggle pattern for the scan chains operating in the hold-toggle mode. The hold-toggle pattern repeats multiple times when the test pattern is being shifted into the scan chains.

20 Claims, 16 Drawing Sheets

(56) References Cited

U.S. PATENT DOCUMENTS

| | | | |
|---|---|---|---|
| 2014/0189455 A1 | 7/2014 | Sonawane et al. | |
| 2015/0253385 A1* | 9/2015 | Rajski | G01R 31/318547 |
| | | | 714/738 |
| 2019/0293717 A1* | 9/2019 | Huang | G01R 31/31835 |
| 2019/0293718 A1* | 9/2019 | Milewski | G01R 31/318335 |

OTHER PUBLICATIONS

Kumar Amit et al., "Isometric Test Data Compression", IEEE Transactions on Computer-Aided Design of Integrated Circuits and Systems, IEEE Service Center, Piscataway, NJ, US, vol. 34, No. 11, Nov. 1, 2015, pp. 1847-1859.

PCT International Search Report and Written Opinion of International Searching Authority dated Jul. 16, 2019 corresponding to PCT International Application No. PCT/US2019/023279 filed Mar. 21, 2019.

\* cited by examiner

|    | Conventional scan | | | Designs with EDT logic | | Hypercompression (HTL) | |
| --- | --- | --- | --- | --- | --- | --- | --- |
|    | Sequential | Combinational | Total | Total | Δx | Total | Δx |
| C1 | 462,203 (0.54) | 724,627 (0.85) | 1,186,830 (1.39) | 1,197,765 (1.40) | 0.92% | 1,200,893 (1.41) | 1.18% |
| C2 | 749,037 (0.88) | 1,057,120 (1.24) | 1,806,157 (2.12) | 1,812,503 (2.12) | 0.35% | 1,814,766 (2.13) | 0.48% |
| C3 | 213,204 (0.25) | 71,419 (0.08) | 284,623 (0.33) | 286,439 (0.33) | 0.64% | 287,101 (0.34) | 0.90% |
| C4 | 713,196 (0.83) | 1,614,419 (1.89) | 2,327,615 (2.72) | 2,335,625 (2.73) | 0.34% | 2,338,450 (2.74) | 0.46% |

FIG. 16

FLEXIBLE ISOMETRIC DECOMPRESSOR ARCHITECTURE FOR TEST COMPRESSION

RELATED APPLICATIONS

This application claims the benefit of U.S. Provisional Patent Application No. 62/646,497, filed on Mar. 22, 2018, titled "Flexible Isometric Decompressor Architecture For Test Compression," and naming Janusz Rajski et al. as inventors, which application is incorporated entirely herein by reference.

FIELD OF THE DISCLOSED TECHNIQUES

The presently disclosed techniques relates to circuit testing. Various implementations of the disclosed techniques may be particularly useful for increasing test compression ratio while reducing test power dissipation.

BACKGROUND OF THE DISCLOSED TECHNIQUES

Test data compression has become instrumental in reducing the overall cost of test. Typically, this technology deploys an external tester to deliver compressed test patterns through a small number of channels, and on-chip decompressors to expand them into scan-compatible data. The first test compression schemes, such as broadcast scan, Illinois scan, VirtualScan, or adaptive scan, do not make a distinction between ATPG (Automatic Test Pattern Generation) and compression. They work with hardwired decompressors defining either temporary or permanent equivalence of scan cells. Consequently, if a scan cell is assigned by ATPG, its value is copied to all equivalent scan cells, which effectively eradicates a separate encoding phase. The next-generation solutions, such as combinational compression and static as well as dynamic LFSR (Linear Feedback Shift Register) reseeding, use a variety of techniques to encode ATPG-produced partially specified test cubes. For example, the embedded deterministic test (EDT) employs a solver of linear equations to derive compressed data (seeds). Early test generation techniques within this class are unaware of a decompressor architecture and its implications on ATPG performance. One of the first steps to change this trend was to combine LFSR seed computation with ATPG-based justification of certain decision nodes.

To reduce test power dissipation, test data encoding schemes should also allow test patterns with low switching activity to be loaded to scan chains. If don't-care bits are filled with random values, then scan toggling can consume much more power than a circuit is rated for. Similarly, the bulk of test power consumption can also be attributed to capture and unloading of test responses. As a result, the power dissipation in the test mode can increase by a factor of 2 to 3 compared to the functional mode, and is only expected to worsen, leading to supply voltage noise or overheating. This can cause a device malfunction, loss of yield, chip reliability degradation, shorter product lifetime, or a device permanent damage.

With the exception of test data reduction, the performance characteristics of low-power test solutions are very different. Some schemes rely on enhanced LFSR reseeding techniques. For example, outputs of two LFSRs can be AND-ed or OR-ed to decrease the amount of switching. Test cubes can also be divided into blocks, and only those with transitions encoded by reseeding. Alternatively, one can freeze a decompressor in certain states and load scan chains with patterns having low transition counts. A low power decompressor used in parallel with a power-aware controller allows further reduction of scan toggling. Several solutions adapted by low-power compression schemes have debuted as stand-alone methods. Typically, they assign non-random values to unspecified bits of test cubes which can otherwise cause power violations. Don't-care bits may also assume values minimizing the number of transitions during scan-in shifting. The resultant test sequences can be run-length encoded. As another option, a minimum transition fill may replicate the value of the most recent care bit. California scan and vector modification use similar techniques. A minimum transition fill scheme uses bit stripping to determine unspecified positions and fill them accordingly to reduce transitions. Other switching-aware filling techniques decrease the capture power by assigning unspecified bits with values that can minimize the number of transitions at the outputs of scan cells in the capture mode.

An isometric test data compression approach, described in A. Kumar, et al., "Isometric test compression," IEEE Trans. CAD, vol. 34, pp. 1847-1859, November 2015, enables more interactions between test generation (ATPG) and test encoding. If f is a test pattern fill rate, then this new paradigm attempts to elevate compression ratios to values well beyond 1/f, i.e., above what is achievable through the best conventional reseeding techniques. The isometric compression deploys an on-chip power-aware test data decompressor in conjunction with a compression-friendly ATPG. This allows loading scan chains with low-transition patterns while successfully encoding a significantly large number of specified bits.

The integration of the industrial test flow with the isometric compression has confirmed the predicted advantages, especially in terms of compression ratios and power consumption. Nevertheless, there are challenges in implementing certain parts of the original isometric decompressor in complex designs in new technology nodes. In particular, template (control) registers used for original isometric decompressor need to match the size of the longest scan chains comprising hundreds of flip-flops. Because of this size, the template registers can only be reloaded with extra regular patterns. To justify this cost, both in terms of test data volume and test time, every single template has to be reused for many patterns. This, in turn, reduces flexibility of the isometric compression. Since the scheme works exclusively with low-power patterns affecting all scan chains, it may also compromise test coverage, if some faults need individually elevated fill rates in certain scan chains, which test templates may not be able to guarantee.

BRIEF SUMMARY OF THE DISCLOSED TECHNIQUES

Various aspects of the disclosed technology relate to flexible isometric decompressor architecture. In one aspect, there is a system for testing a circuit, comprising: scan chains comprising scan cells, the scan chains configured, in a test mode, to shift in test patterns, apply the test patterns to the circuit, capture test responses of the circuit, and shift out the test responses; a controller comprising first storage circuitry, second storage circuitry, and a control signal generator, the first storage circuitry comprising circuitry configured to store operational mode information, the second storage circuitry comprising circuitry configured to store information of a hold-toggle pattern, and the control signal generator configured to generate a control signal based on the operational mode information and the hold-toggle pattern, wherein the operational mode information determines whether a scan chain operates in a full-toggle mode or in a hold-toggle mode during a shift period, the hold-toggle pattern determines in which shift clock cycles in a segment of consecutive shift clock cycles scan chains operating in the hold-toggle mode receive bits based on corresponding bits of a test pattern during the shift period, and the hold-toggle pattern repeats multiple times during the shift period, the shift period being a period when the test pattern is being shifted into the scan chains; and hold-toggle circuitry coupled to the controller and configured to allow, according to the control signal, some scan chains in the scan chains to operate in the full-toggle mode and some other scan chains in the scan chains to operate in the hold-toggle mode during the shift period.

The system may further comprise: a decompressor, outputs of the hold-toggle circuitry being coupled to inputs of the decompressor or inputs of an expander in the decompressor. The decompressor may comprise a ring generator and the expander may be a phase shifter.

The hold-toggle circuitry may comprise a plurality of subunits, each of the plurality of subunits being controlled by a bit of the control signal.

The second storage circuitry may comprise a circular shift register. The circular shift register may have 32 or fewer than 32 bits.

The first storage circuitry may comprise one or two pairs of register and decoder. The decoder may be a one-hot decoder.

The control signal generator may comprise a plurality of subunits, each subunit combining an output of the second storage circuitry with one or more outputs of the first storage circuitry. The plurality of subunits may be OR gates.

In another aspect, there are one or more non-transitory computer-readable media storing computer-executable instructions for causing one or more processors to perform a method, the method comprising: creating the above system in a circuit design for testing a circuit fabricated according to the circuit design.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed techniques. Thus, for example, those skilled in the art will recognize that the disclosed techniques may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

FIG. 16 shows a table of the silicon real estate taken up by test circuitry in terms of equivalent area of 2-input NAND gates (measured also in $mm^2$) for 4 industrial circuits.

DETAILED DESCRIPTION OF THE DISCLOSED TECHNIQUES

General Considerations

Various aspects of the disclosed technology relate to flexible isometric decompressor architecture. In the following description, numerous details are set forth for the purpose of explanation. However, one of ordinary skill in the art will realize that the disclosed technology may be practiced without the use of these specific details. In other instances, well-known features have not been described in details to avoid obscuring the disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

The detailed description of a method or a device sometimes uses terms like "generate" and "make" to describe the disclosed method or the device function/structure. Such terms are high-level descriptions. The actual operations or functions/structures that correspond to these terms will vary depending on the particular implementation and are readily discernible by one of ordinary skill in the art.

Additionally, as used herein, the term "design" is intended to encompass data describing an entire integrated circuit device. This term also is intended to encompass a smaller group of data describing one or more components of an entire device such as a portion of an integrated circuit device nevertheless.

Illustrative Operating Environment

Figure 1:
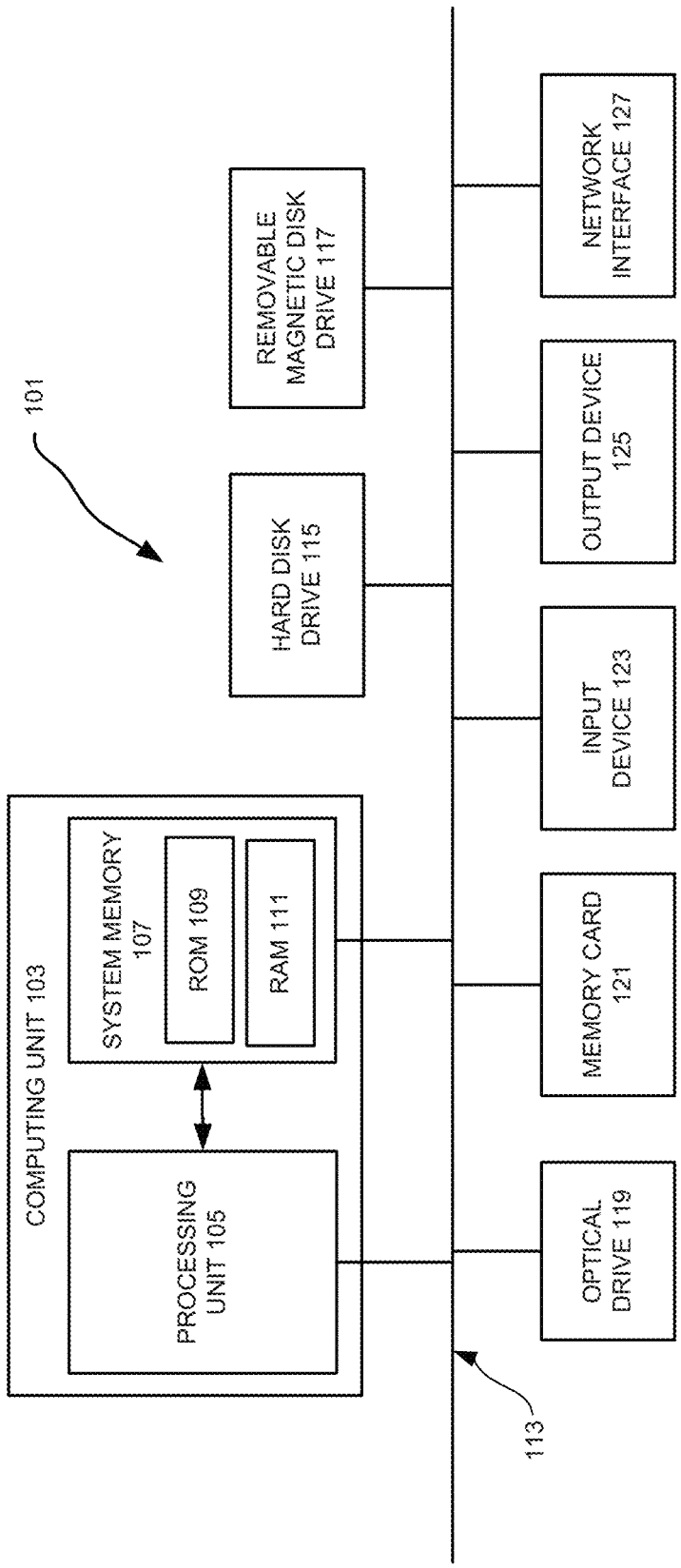
FIG. 1 illustrates a programmable computer system with which various embodiments of the disclosed technology may be employed.

Various examples of the disclosed technology may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but it will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it is not intended to be limiting. Various embodiments of the disclosed technology may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the disclosed technology may be implemented using a multi-processor computer, a plurality of single and/or multiprocessor computers arranged into a network, or some combination of both.

Design for Test, Test Pattern Generation, and Testing

The reduction in feature size increases the probability that a manufacture defect in the integrated circuit will result in a faulty chip. A very small defect can result in a faulty transistor or interconnecting wire. Even a single faulty transistor or wire can cause the entire chip to function improperly. Manufacture defects are unavoidable nonetheless, no matter whether the manufacturing process is at the prototype stage or the high-volume manufacturing stage. It is thus necessary to test chips during the manufacturing process. Diagnosing faulty chips is also needed to ramp up and to maintain the manufacturing yield.

Testing typically includes applying a set of test stimuli (test patterns) to the circuit-under-test and then analyzing responses generated by the circuit-under-test. Functional testing attempts to validate that the circuit-under-test operates according to its functional specification while structural testing tries to ascertain that the circuit-under-test has been assembled correctly from some low-level building blocks as specified in a structural netlist and that these low-level building blocks and their wiring connections have been manufactured without defect. For structural testing, it is assumed that if functional verification has shown the correctness of the netlist and structural testing has confirmed the correct assembly of the structural circuit elements, then the circuit should function correctly. Structural testing has been widely adopted at least in part because it enables the test (test pattern) generation to focus on testing a limited number of relatively simple circuit elements rather than having to deal with an exponentially exploding multiplicity of functional states and state transitions.

To make it easier to develop and apply test patterns, certain testability features are added to circuit designs, which is referred to as design for test or design for testability (DFT). Scan testing is the most common DFT method. In a basic scan testing scheme, all or most of internal sequential state elements (latches, flip-flops, et al.) in a circuit design are made controllable and observable via a serial interface. These functional state elements are usually replaced with dual-purpose state elements called scan cells. Scan cells are connected together to form scan chains—serial shift registers for shifting in test patterns and shifting out test responses. A scan cell can operate as originally intended for functional purposes (functional/mission mode) and as a unit in a scan chain for scan (scan mode). A widely used type of scan cell include an edge-trigged flip-flop with two-way multiplexer for the data input. The two-way multiplexer is typically controlled by a single control signal called scan enable, which selects the input signal for a scan cell from either a scan signal input port or a system signal input port. The scan signal input port is typically connected to an output of another scan cell while the system signal input port is connected to the functional logic. Scan cells can serve as both a control point and an observation point. Control points can be used to set certain logic values at some locations of the circuit-under-test, exciting (activating) a fault and propagating the incorrect value to an observation point. Scan testing allows the test equipment to access gates deeply embedded through the primary inputs/outputs and/or some physical test points and can remove the need for complicated state transition sequences when trying to control or observe what is happening at some internal circuit element.

Test patterns for scan testing are typically generated through an automatic test pattern generation (ATPG) process. ATPG usually focuses on a set of faults derived from a gate-level fault model. A defect is a flaw or physical imperfection caused in a device during the manufacturing process. A fault model (or briefly a fault) is a description of how a defect alters design behavior. For a given target fault, ATPG comprises two phases: fault activation and fault propagation. Fault activation establishes a signal value at the fault site opposite that produced by the fault. Fault propagation propagates the fault effect forward by sensitizing a path from a fault site to a scan cell or a primary output. A fault at a site is said to be detected by a test pattern if a test response value captured by a scan cell or a primary output is different than the expected value. The objective of ATPG is to find a test pattern that, when applied to the circuit, enables testers to distinguish between the correct circuit behavior and the faulty circuit behavior caused by one or more particular faults. Effectiveness of ATPG is measured by the fault coverage achieved for the fault model and the number of generated vectors (test pattern counts), which should be directly proportional to test application time. Here, the fault coverage is defined as a ratio of the number of detected faults vs. the total number of faults.

The most popular fault model used in practice is the single stuck-at fault model. In this model, one of the signal lines in a circuit is assumed to be stuck at a fixed logic value, regardless of what inputs are supplied to the circuit. The stuck-at fault model is a logical fault model because no delay information is associated with the fault definition. Delay faults cause errors in the functioning of a circuit based on its timing. They are caused by the finite rise and fall time periods of the signals in the gates, as well as, the propagation delay of interconnects between the gates. Transition faults are used for their simplicity in modeling spot defects that affect delays at inputs or outputs of gates. Under scan-based tests, the transition faults are associated with an extra delay that is large enough to cause the delay of any path through the fault site to exceed the clock period. Cell internal fault models can be derived using transistor-level circuit simulations (analog simulations). This approach can pinpoint the defect location within a cell for various cell internal defects.

During the circuit design and manufacturing process, a manufacturing test screens out chips (dies) containing defects. The test itself, however, does not identify the reason for the unacceptable low or fluctuating yield that may be observed. Physical failure analysis (PFA) can inspect the faulty chip to locate the defect location(s) and to discover the root cause. The process usually includes etching away certain layers and then imaging the silicon surface by scanning electronic microscopy or focused ion beam systems. This PFA process is laborious and time consuming. To facilitate the PFA process, diagnosis (also referred to as scan diagnosis) is often employed to narrow down possible locations of the defect(s) based on analyzing the fail log (fail file, failure file). The fail log typically contains information about when (e.g., tester cycle), where (e.g., at what tester channel), and how (e.g., at what logic value) the test failed and which test patterns generate expected test responses. The layout information of the circuit design may also be employed to further reduce the number of defect suspects.

Test application in chip manufacturing test is normally performed by automatic test equipment (ATE) (a type of testers). Scan-based tests consume significant amounts of storage and test time on ATE. The data volume increases with the number of logic gates on the chip and the same holds for the number of scan cells. Yet, practical considerations and ATE specifications often limit both the number of pins available for scan in/out and the maximum scan frequency. It is highly desirable to reduce the amount of test data that need to be loaded onto ATE and ultimately to the circuit under test. Fortunately, test patterns are compressible mainly because only 1% to 5% of test pattern bits are typically specified bits (care bits) while the rest are unspecified bits (don't-care bits). Unspecified bits can take on any values with no impact on the fault coverage. Test compression may also take advantage of the fact that test cubes tend to be highly correlated. A test cube is a deterministic test pattern in which the don't-care bits are not filled by ATPG. The correlation exists because faults are structurally related in the circuit.

Various test compression techniques have been developed. In general, additional on-chip hardware before and after scan chains is inserted. The hardware (decompressor) added before scan chains is configured to decompress test stimulus coming from ATE, while the hardware (compactor) added after scan chains is configured to compact test responses captured by the scan chains. The decompressor expands the data from n tester channels to fill greater than n scan chains. The increase in the number of scan chains shortens each scan chain and thus reduces the number of clock cycles needed to shift in each test pattern. Thus, test compression can not only reduce the amount of data stored on the tester but also reduce the test time for a given test data bandwidth.

The embedded deterministic test (EDT) is one example of test compression techniques. The EDT-based compression is composed of two complementary parts: hardware that is embedded on chip, and deterministic ATPG software that generates compressed patterns that utilize the embedded hardware. The EDT hardware features a continuous-flow decompressor. The EDT compression of test cubes is performed by treating the external test data as Boolean variables. Scan cells are conceptually filled with symbolic expressions that are linear functions of input variables injected into the decompressor. In the case of a decompressor comprising a ring generator and an associated phase shifter, a set of linear equations corresponding to scan cells whose values are specified may be used. A compressed pattern can be determined by solving the system of equations. If the compressed pattern determined as such is then scanned in through the decompressor, the bits that were specified by ATPG will be generated accordingly. Unspecified bits are set to pseudorandom values based on the decompressor architecture. Additional details concerning EDT-based compression and decompression are found in J. Rajski, J. Tyszer, M. Kassab, and N. Mukherjee, "Embedded deterministic test," IEEE Trans. CAD, vol. 23, pp. 776-792, May 2004, and U.S. Pat. Nos. 6,327,687; 6,353,842; 6,539, 409; 6,543,020; 6,557,129; 6,684,358; 6,708,192; 6,829, 740; 6,874,109; 7,093,175; 7,111,209; 7,260,591; 7,263, 641; 7,478,296; 7,493,540; 7,500,163; 7,506,232; 7,509, 546; 7,523,372; 7,653,851, of which all are hereby incorporated herein by reference.

Logic built-in self-test (logic BIST) is a DFT technique that permits a circuit to test itself using embedded test logic without the need of an external tester. Classical logic BIST applications include detecting infant mortality defects during burn-in test, enabling the use of low-cost and/or low-speed testers that only provide power and clock signals, and in-system self-testing to improve the reliability of the system in aerospace/defense, automotive, telecommunications and healthcare industries. A typical logic BIST system includes a test pattern generator for automatically generating test patterns, a test response analyzer (compactor) for compacting test responses into a signature and a logic BIST controller for coordinating the BIST operation and for providing a pass/fail indication. A pseudo-random pattern generator (PRPG), a commonly used test pattern generator, can be constructed from a linear feedback shift register (LFSR) or a cellular automaton. To increase the fault coverage, a weighted LFSR may be employed. Another approach is to combine random test patterns with deterministic patterns in some fashion as the BIST logic can be used to handle compressed test patterns that are generated deterministically and stored on chip.

All of the above mentioned processes, design insertion for testing, test pattern generation, and logic diagnosis, are normally performed by various electronic design automation tools such as those in the Tessent family of software tools available from Mentor Graphics Corporation, Wilsonville, Oreg.

Flexible Isometric Decompressor System

Figure 2:
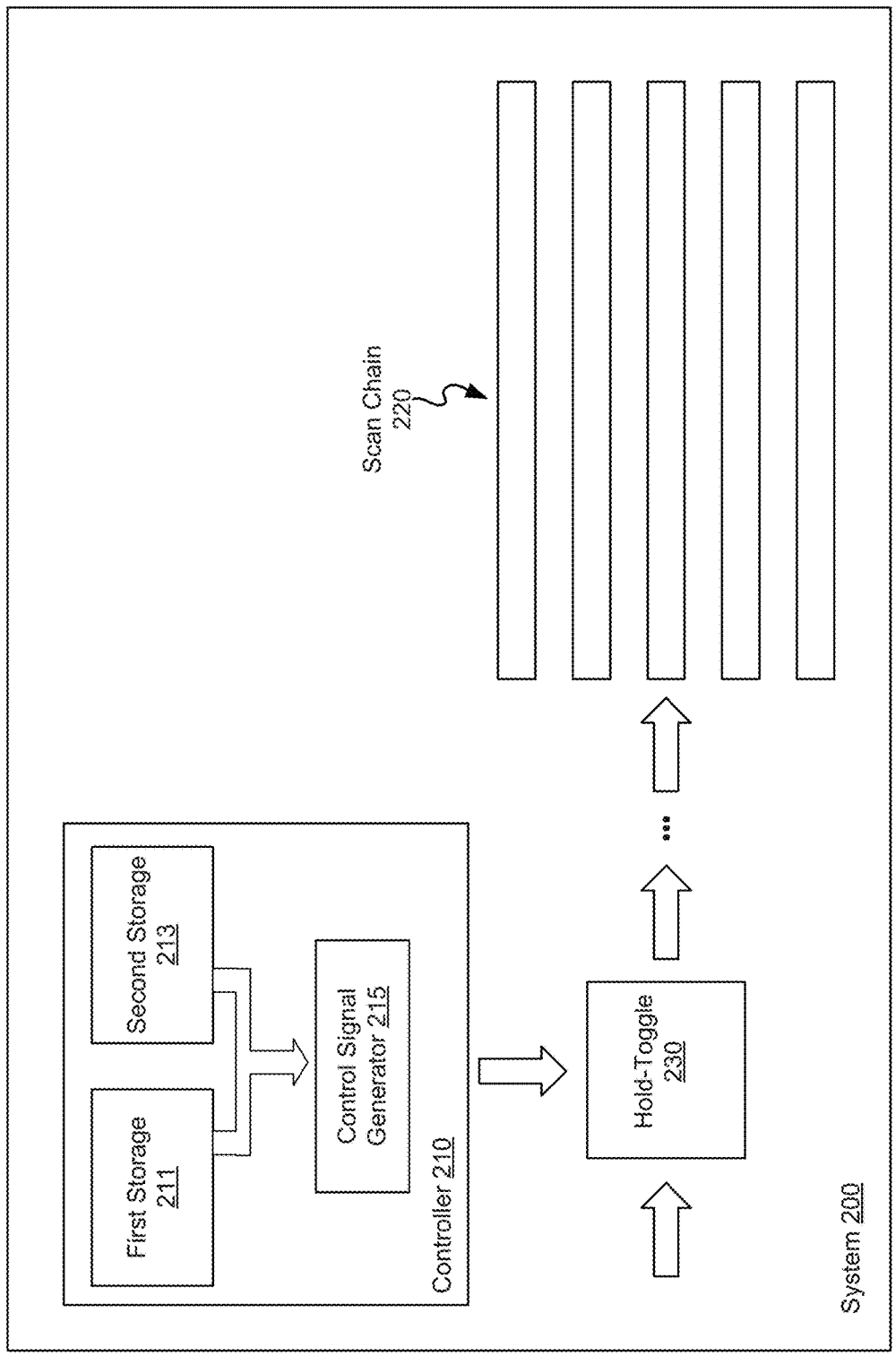
FIG. 2 illustrates an example of a test compression system 200 according to various embodiments of the disclosed technology.

FIG. 2 illustrates an example of a test compression system 200 according to various embodiments of the disclosed technology. The system 200 comprises a controller 210, scan chains 220, and hold-toggle circuitry 230. The scan chains 220, comprising scan cells, are configured in a test mode to shift in test patterns, apply the test patterns to the circuit, capture test responses of the circuit, and shift out the test responses. The controller 210 comprises first storage circuitry 211, second storage circuitry 213, and a control signal generator 215. The first storage circuitry 211 comprises circuitry for storing operational mode information. The operational mode information determines in which mode (a full-toggle mode or a hold-toggle mode) a scan chain operates when a test pattern is being shifted into the scan chains. A scan chain operating in the full-toggle mode receives bits based on corresponding bits of the test pattern. A scan chain operating in the hold-toggle mode receives bits based on corresponding bits of the test pattern (toggling) only in a predetermined number of inconsecutive shift clock cycles and constant bits (holding) in the rest of shift clock cycles for shifting the test pattern into the scan chains. The operational mode information may be delivered to the first storage circuitry 211 from an on-chip or off-chip storage place, or by a processor or by ATE.

The second storage circuitry 213 comprises circuitry for storing information of a hold-toggle pattern. The information of the hold-toggle pattern may be delivered to the second storage circuitry 213 from an on-chip or off-chip storage place, or by a processor or by ATE. The hold-toggle pattern determines in which shift clock cycles in a segment of consecutive shift clock cycles scan chains operating in the hold-toggle mode receive bits based on corresponding bits of the test pattern when a test pattern is being shifted into the scan chains. The hold-toggle pattern repeats multiple times during the scan shift period. For example, the longest scan chain has 600 scan cells. Accordingly, 600 shift clock cycles are needed to load a test pattern into the scan chains. The hold-toggle pattern covers 30 shift clock cycles and thus repeats 20 times during the scan shift period. The control signal generator 215 is configured to generate control signals based on the operational mode information and the hold-toggle pattern.

The hold-toggle circuitry 230 is configured to allow, according to the control signals received from the controller 210, some scan chains in the scan chains to operate in the full-toggle mode and some other scan chains in the scan chains to operate in the hold-toggle mode when the test pattern is shifted into the scan chains.

Figure 3:
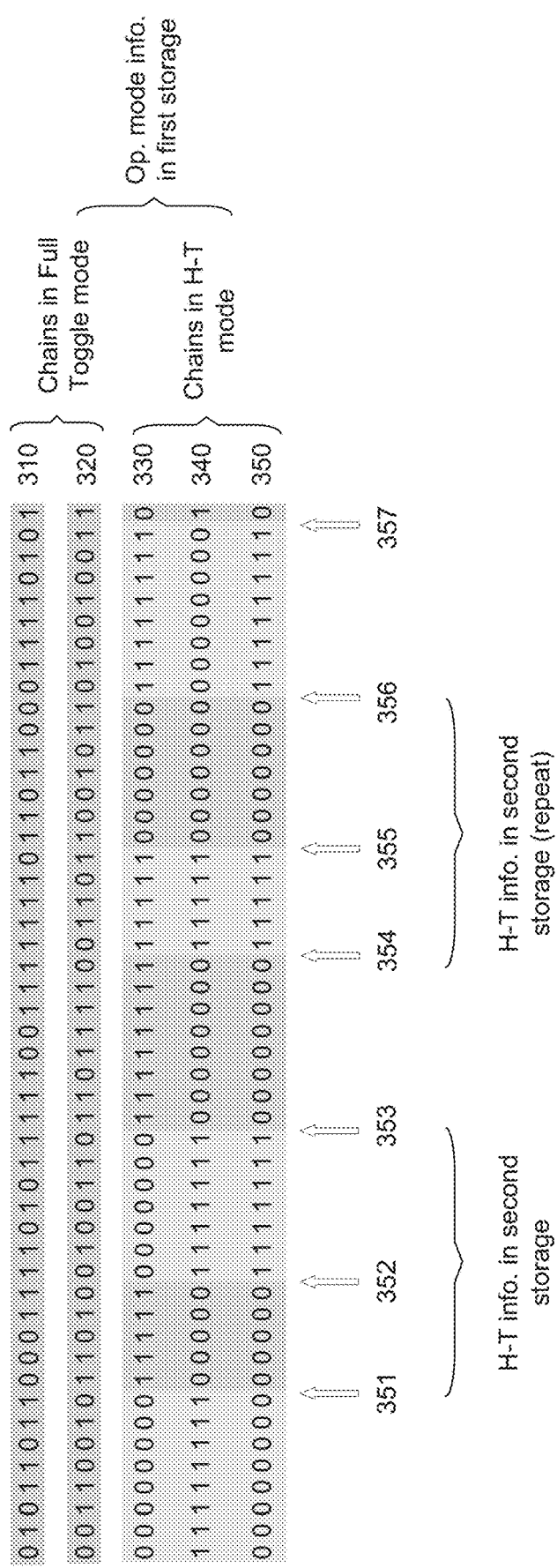
FIG. 3 illustrates an example of test pattern bits shifted into scan chains using the test compression system shown in FIG. 2.

FIG. 3 illustrates an example of test pattern bits shifted into scan chains using the system 200. Here, scan chains 310 and 320 operate in the full toggle mode whereas scan chains 330, 340, and 350 operate in the hold-toggle mode. As can be seen in the figure, bits in the scan chains 310 and 320 have no apparent regular patterns, changing according to the original test pattern. Those in the scan chains 330, 340, and 350, however, show consecutive "1s" alternating with consecutive "0s". The figure shows seven toggle points 351-357, where bits in the scan chains 330, 340, 350 may flip. Whether or not to flip depends on what is the next bit according to the original test pattern. If the upcoming bit is the same as the current one, then no toggle occurs such as the toggle point 354 on the scan chain 330, the toggle point 356 on the scan chain 340, and the toggle point 351 on the scan chain 350. Otherwise, the bit is flipped or inverted at the toggle points. Another feature shown in FIG. 3 is the three toggle points 351-353 form a set of toggle points, specifying a hold-toggle pattern along with the hold points. This hold-toggle pattern repeats itself for the next three toggle points 354-356. In fact, the last toggle point 357, like the toggle point 354, is a repeat of the toggle point 351.

Figure 4:
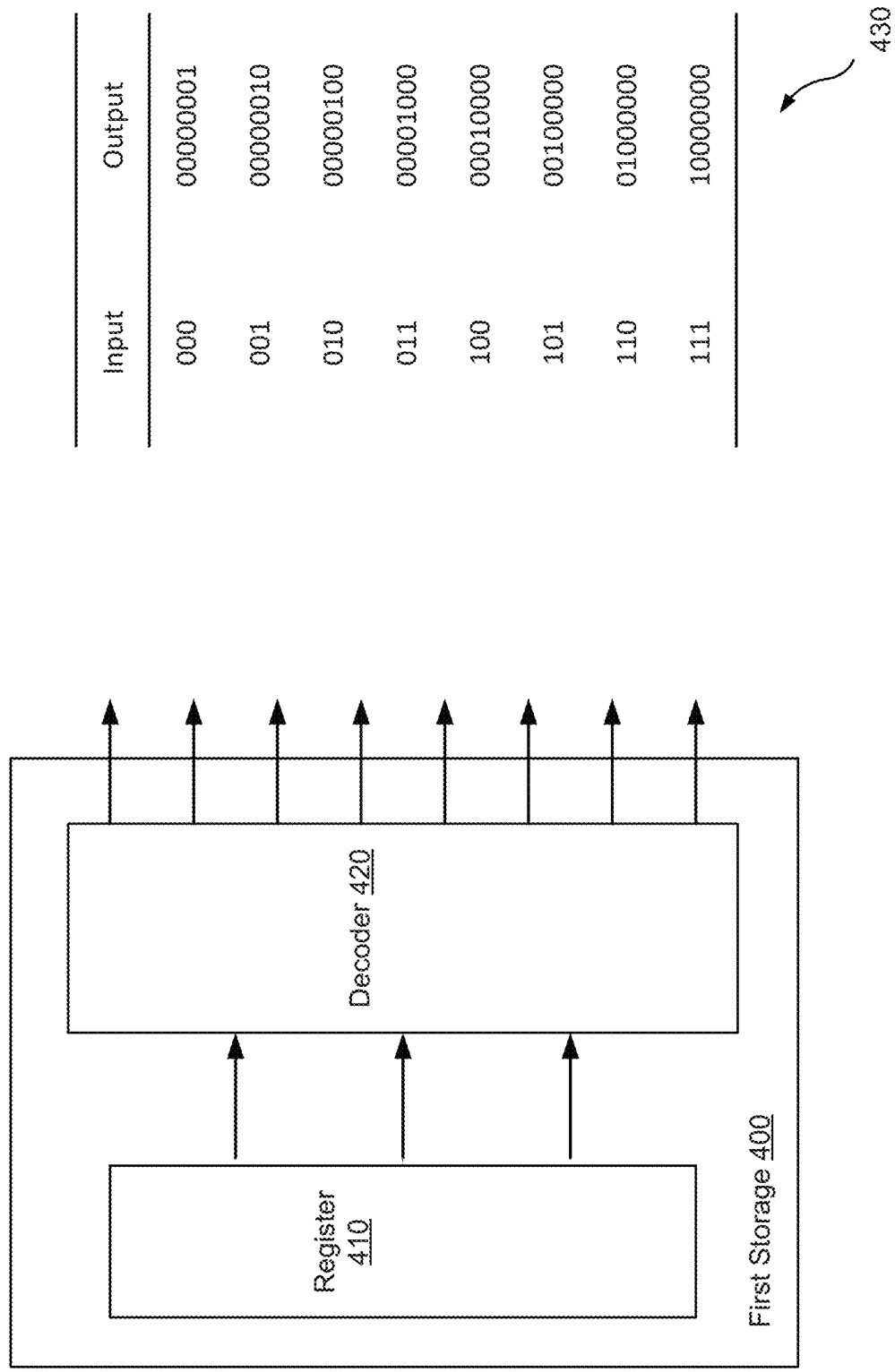
FIG. 4 illustrates an example of a block diagram of first storage circuitry according to some embodiments of the disclosed technology.

FIG. 4 illustrates an example of a block diagram of first storage circuitry 400 according to some embodiments of the disclosed technology. The first storage circuitry 400 comprises a register 410 and a decoder 420. Also shown in FIG. 4 is an example of a truth table 430 assuming that the register 410 is a three-bit register and that the decoder 420 has three inputs and eight outputs. As the truth table 430 indicates, one of the eight outputs ($2^3$) of the first storage circuitry 400 can be asserted according to a three-bit value, which can be used to set one or a small fraction of scan chains to operate in the full toggle mode, which will be explained in detail below. The decoder 420 may be implemented by a tap decoder or a one-hot decoder.

Figure 5:
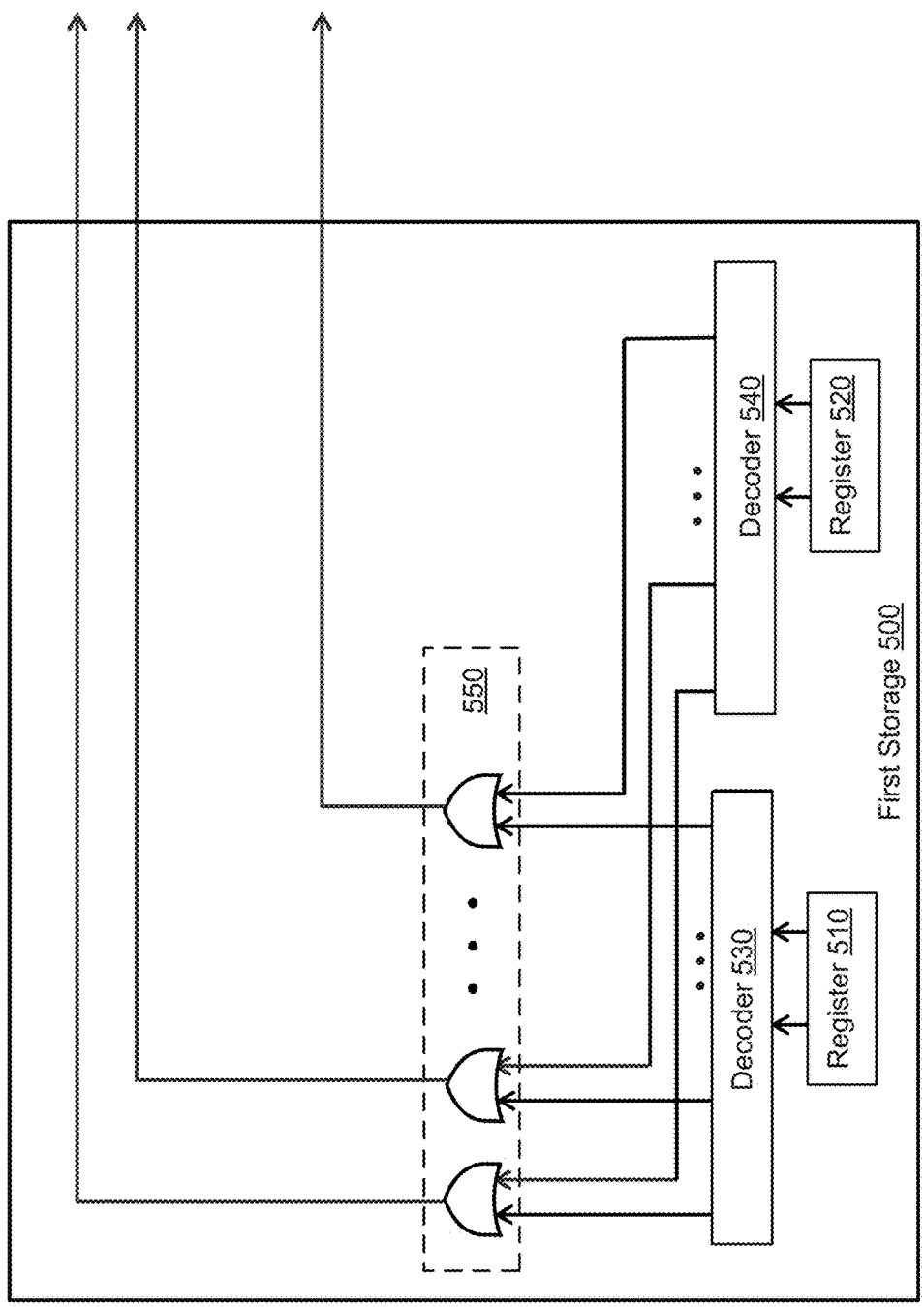
FIG. 5 illustrates an example of a block diagram of first storage circuitry configurable to output ones on two of its outputs according to some embodiments of the disclosed technology.

Some test logic may need more than one output of the first storage circuitry to be able to be asserted and thus to enable more scan chains to operate in the full toggle mode. FIG. 5 illustrates an example of a block diagram of first storage circuitry 500 configurable to output ones on two of its outputs according to some embodiments of the disclosed technology. The first storage circuitry 500 comprises two pairs of register and decoder, 510/530 and 520/540, and a plurality of OR gates 550. Each register/decoder pair outputs a one on one of its outputs. The plurality of OR gates 550 combines the output signals from the two register/decoder pairs, 510/530 and 520/540. By storing different values in the two registers 510 and 520, the first storage circuitry can output "1s" on two of its outputs.

Figure 6:
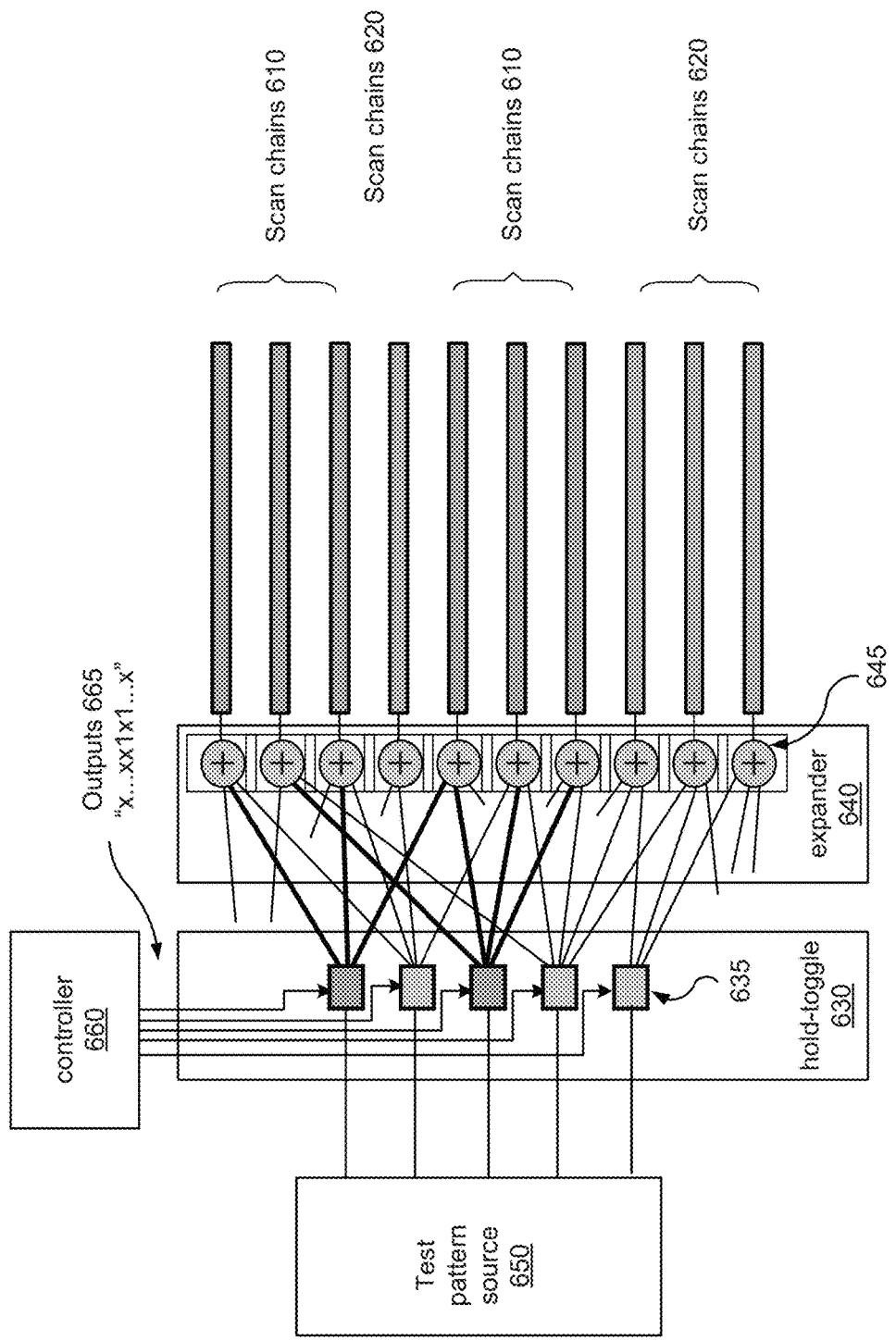
FIG. 6 illustrates a block diagram for how to use two asserted outputs of the controller to make multiple scan chains operate in the full-toggle mode according to some embodiments of the disclosed technology.

FIG. 6 illustrates a block diagram 600 for how to use two asserted outputs of the controller to make multiple scan chains operate in the full-toggle mode according to some embodiments of the disclosed technology. The block diagram 600 has scan chains 610 and 620, the hold-toggle circuitry 630, the controller 660, expander circuitry 640, and a test pattern source 650. The controller 660 has an output signal 665, "x . . . xx1x1 . . . x." Here, two bits are set to "1" based on the operational mode information stored in the controller 660, and the rest of the bits are represented by "x" because they can be "1" or "0" based on the hold-toggle pattern which is also stored in the controller 660. The hold-toggle circuitry 630 comprises a plurality of subunits 635. Each of the subunits 635 receives a signal bit from the test pattern source 650 and is controlled by a bit of the output signal 665. An example of the test pattern source 650 is a part of a decompressor. The expander circuitry 640 comprises an XOR gate network 645. This type of the expander circuitry is sometimes referred to as a phase shifter. The XOR gate network 645 mixes outputs of the hold-toggle circuitry 630 and allows the scan chains to be driven by a smaller number of input lines. In this example, while only two outputs of the controller 660 are set to "1", six scan chains 610 are configured to operate in the full-toggle mode when the test pattern is being shifted in. Even though only four scan chains 620 are shown to operate in the hold-toggle mode, many more of the scan chains do so according to various embodiments of the disclosed technology.

Figure 7:
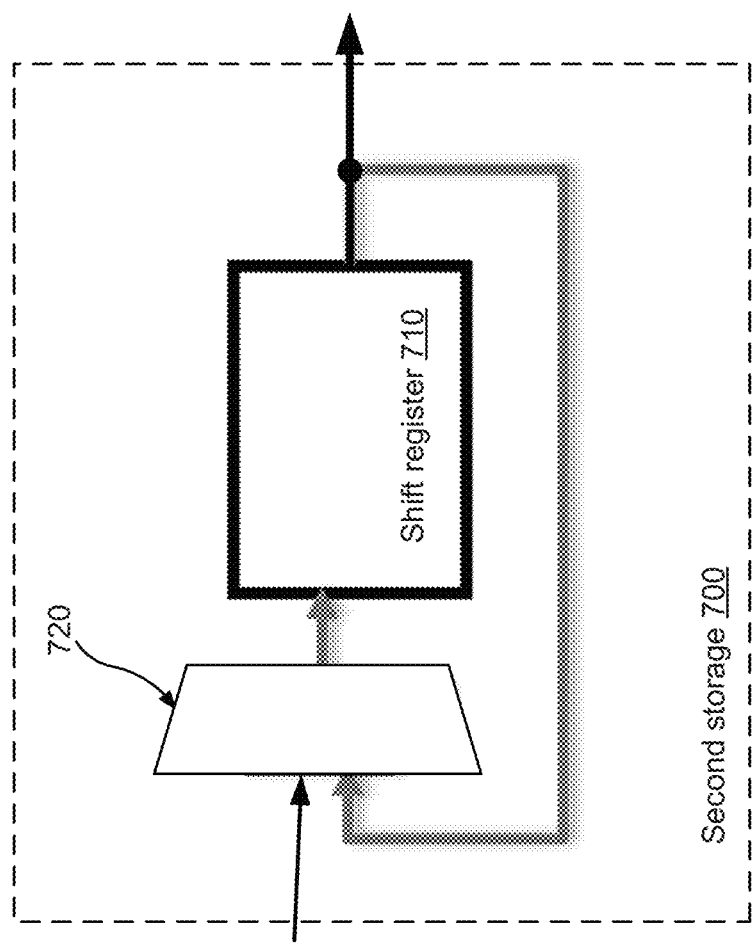
FIG. 7 illustrates an example of a block diagram of second storage circuitry according to some embodiments of the disclosed technology.

FIG. 7 illustrates an example of a block diagram of second storage circuitry 700 according to some embodiments of the disclosed technology. The second storage circuitry 700 comprises a shift register 710 and a multiplexer 720. The multiplexer 720 has one input coupled to the output of the shift register 710 and the other receiving the information of the hold-toggle pattern for loading/updating the shift register 710. Typically, the multiplexer 720 is set such that the shift register 710 operates as a circular register when a test pattern is shifted into the scan chains. This allows a small size of a hold-toggle pattern to control hold/toggle during the whole shift process. Modern complex designs can have hundreds of scan cells on a scan chain, but the size of the second shift register 710 with some implementations of the disclosed technology can be a two to three dozen-bit register. This allows the hold-toggle pattern to be updated frequently during the test.

Figure 8:
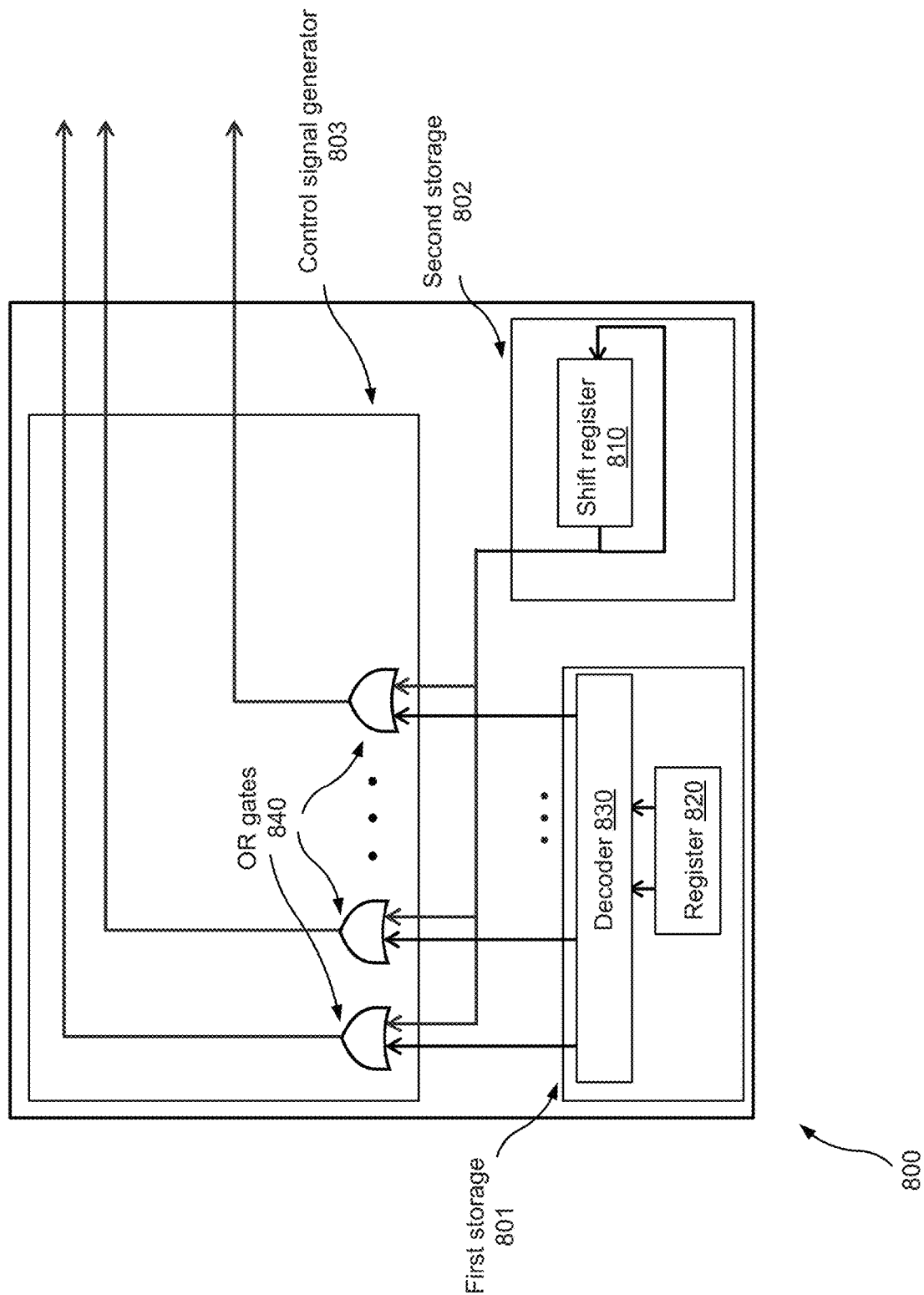
FIG. 8 illustrates an example of a block diagram of a controller according to some embodiments of the disclosed technology.

FIG. 8 illustrates an example of a block diagram of a controller 800 according to some embodiments of the disclosed technology. Like the controller 210 shown in FIG. 2, the controller 800 comprises first storage circuitry 801, second storage circuitry 802, and a control signal generator 803. Like the first storage circuitry 400 shown in FIG. 4, the first storage circuitry 801 comprises a register 820 and a decoder 830. Like the second storage circuitry 700 shown in FIG. 7, the second storage circuitry 802 comprises a circular shift register 810. The control signal generator 803 comprises a plurality of OR gates 840. Each of the OR gates 840 combines one bit of the signal outputted by the decoder 830 and the signal outputted by the circular shift register 810. If the decoder 830 is a one-hot decoder, one of the OR gates 840 can keep "1" on its output when a test pattern is being shifted into the scan chains, which sets one or more scan chains to operate in the full-toggle mode. The rest of the OR gates 840 output "1" (toggle) or "0" (hold) based on the output of the circular shift register 810, setting the corresponding scan chains to operate in the hold-toggle mode.

Figure 9:
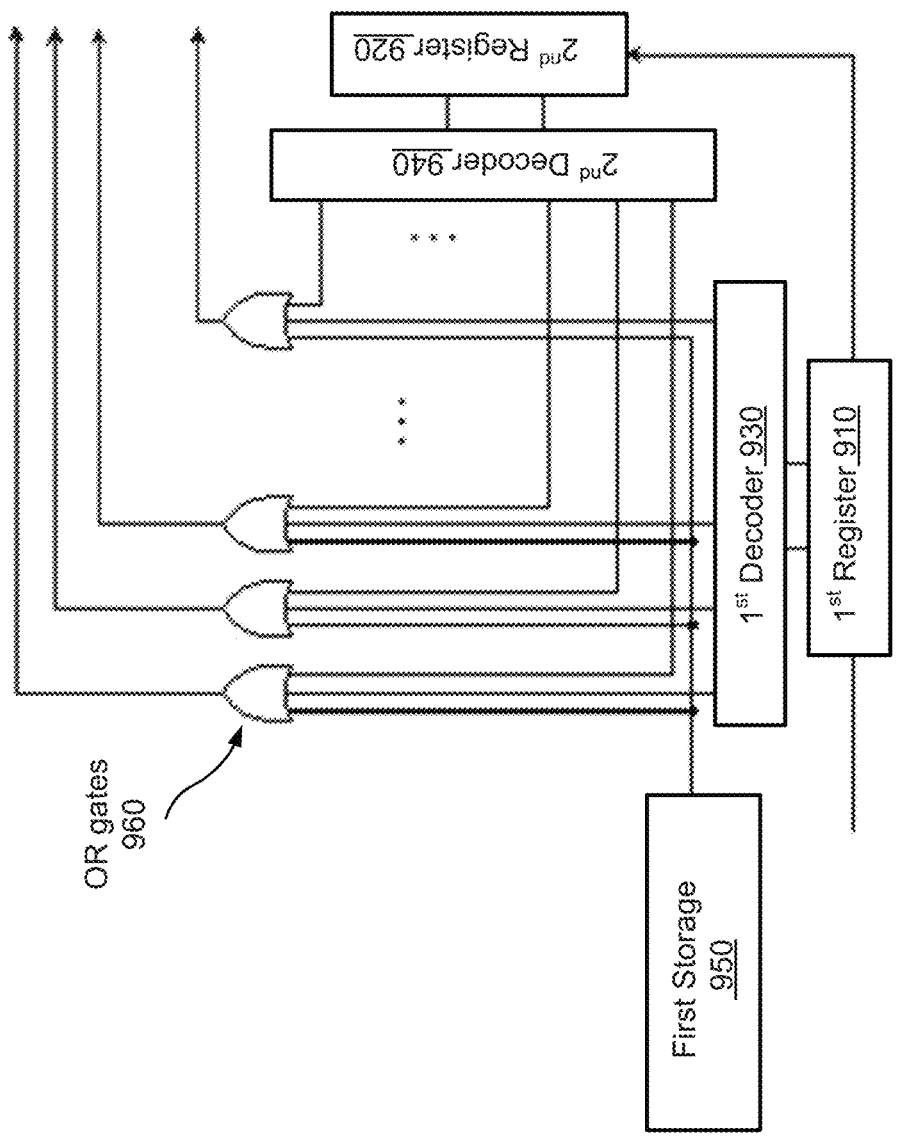
FIG. 9 illustrates an example of a block diagram of a controller configured to directly combine outputs of two decoders of first storage circuitry with outputs of second storage circuitry.

The first storage circuitry 801 may comprise more than one register-decoder pairs, similar to the first storage circuitry 500 shown in FIG. 5. In FIG. 5, the outputs of the two register-decoder pairs, 510-530 and 520-540, are combined by the OR gates 550. Rather than use separate OR gates in both the first storage circuitry 801 and the control signal generator 803, one set of OR gates can fulfill two functions simultaneously. FIG. 9 illustrates an example of such a controller. As can be seen in the figure, each of OR gates 960 has three inputs, receiving signals from first storage circuitry 950, one of the bits outputted by a pair of $1^{st}$ decoder 930 and $1^{st}$ register 910, and one of the bits outputted by a pair of $2^{nd}$ decoder 940 and $2^{nd}$ register 920, respectively. This approach can be applied to a controller more than two register-decoder pairs.

Figure 10:
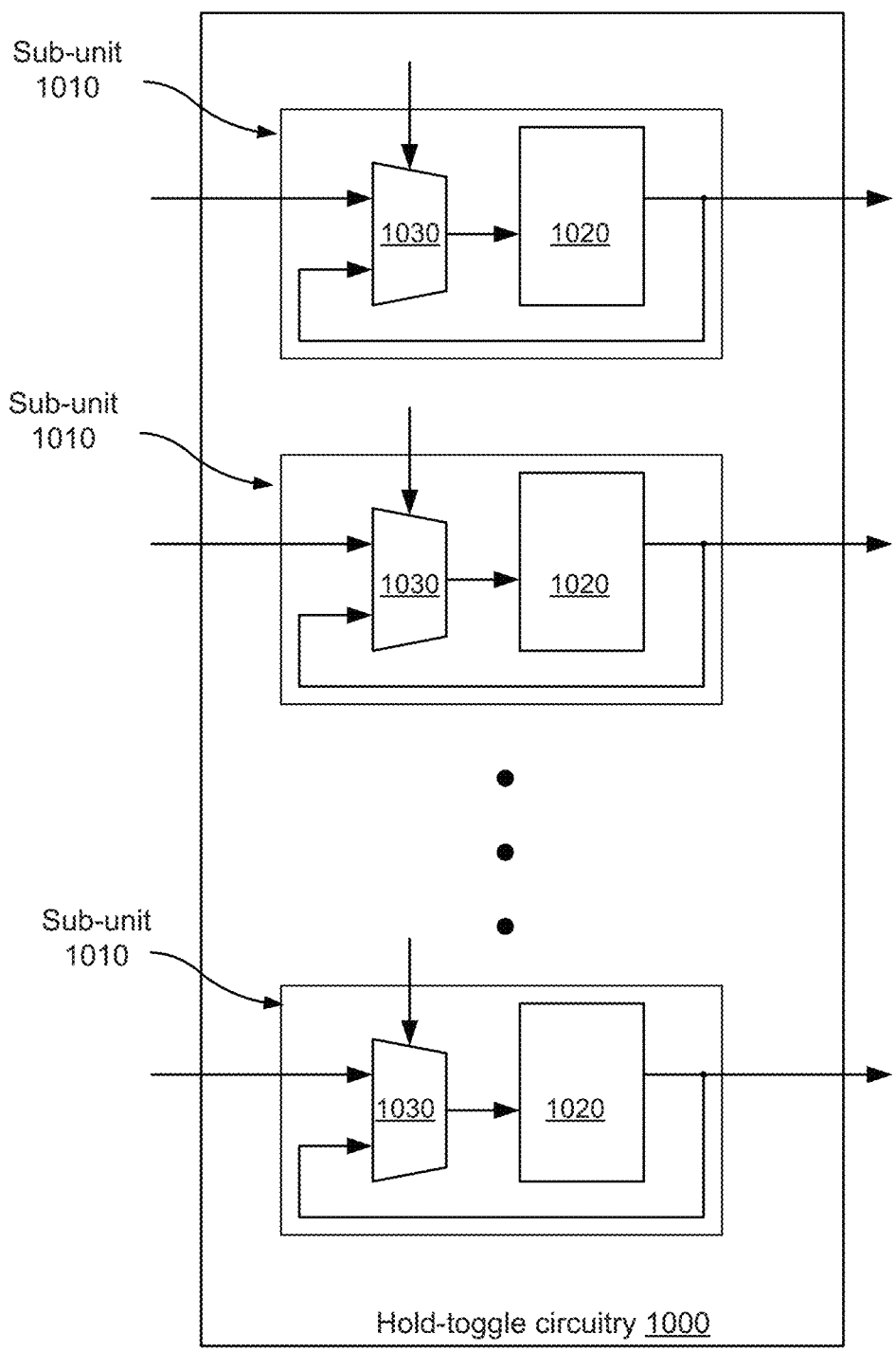
FIG. 10 illustrates an example of a block diagram of hold-toggle circuitry according to some embodiments of the disclosed technology.

FIG. 10 illustrates an example of a block diagram of hold-toggle circuitry 1000 according to some embodiments of the disclosed technology. The hold-toggle circuitry 1000 comprises a plurality of sub-units 1010. Each of the plurality of sub-units 1010 comprises a state element 1020 and a multiplexer 1030. The state element 1020 can be implemented by a latch. Each of the multiplexers 1030 has two inputs, receiving signals from a bit of a test pattern source and the output of the corresponding state element 1020, respectively. Each of the multiplexers 1030 is controlled by one bit of a control signal generated by a controller like the controller 210 shown in FIG. 2. If the output k of the controller keeps being asserted (keeping as "1") according to the operational mode information, then the $k_{th}$ sub-unit 1010 of the hold-toggle circuitry 1000 becomes transparent allowing the $k_{th}$ output of the test pattern source to feed directly or indirectly the scan chains. As a result, these scan chains enter the full toggle mode. The scan chains operating in the hold-toggle mode will receive either bits of the original test pattern or the previous bits stored by the corresponding state elements 1020 based on the hold-toggle pattern.

It should be noted that FIGS. 4-10 show some examples of the first storage circuitry, the second storage circuitry, the control signal generator, and/or the hold-toggle circuitry. A person of ordinary skill in the art will appreciate that various different circuits can be used to implement one or more of the first storage circuitry, the second storage circuitry, the control signal generator, and the hold-toggle circuitry.

Figure 11:
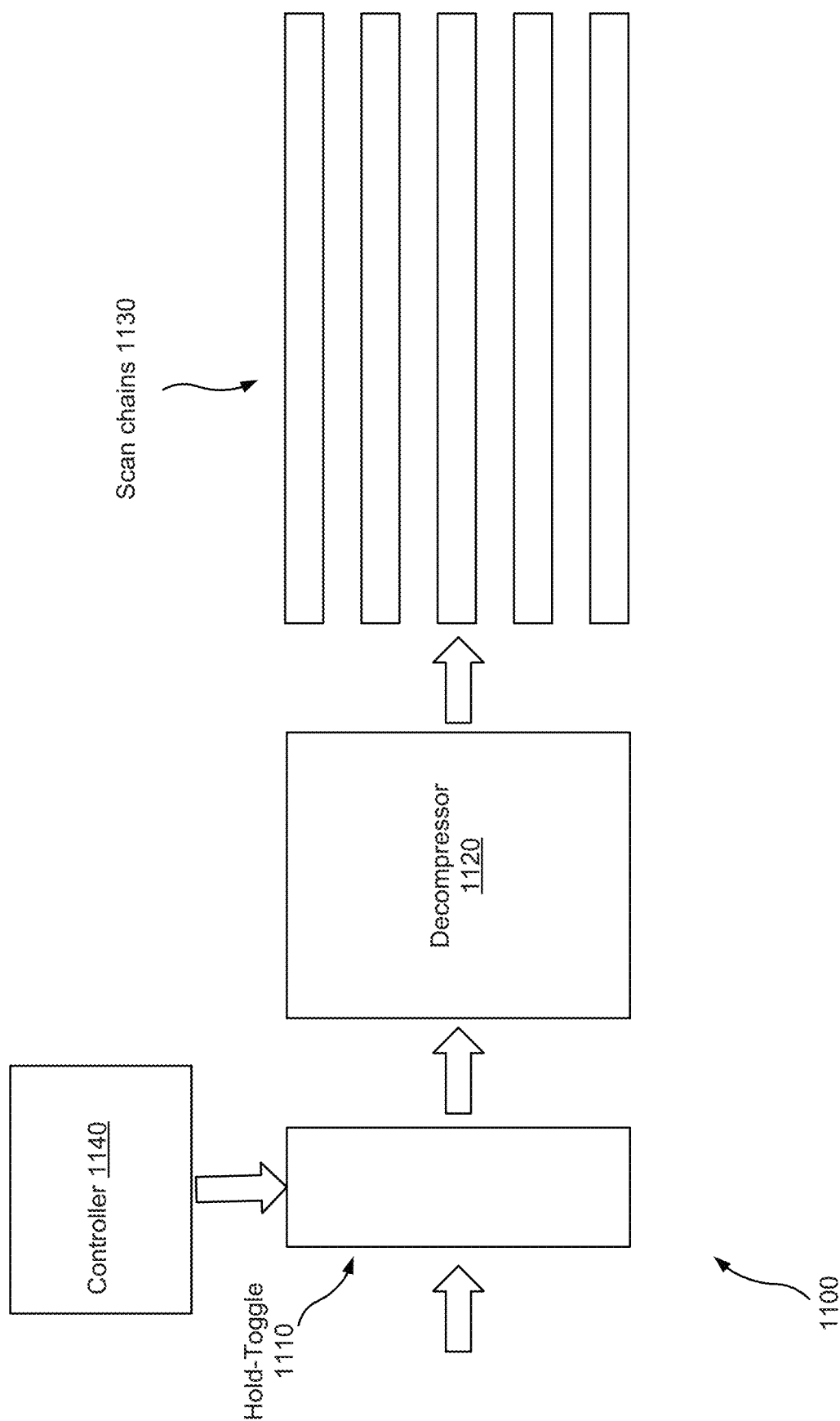
FIG. 11 illustrates an example of a test compression system in which hold-toggle circuitry is coupled indirectly to scan chains through a decompressor according to some embodiments of the disclosed technology.

FIG. 11 illustrates an example of a system 1100 in which hold-toggle circuitry 1110, controlled by a controller 1140, is coupled indirectly to scan chains 1130 through a decompressor 1120. The decompressor can be of various types such as an Illinois Scan-based decompressor and a combinational decompressor.

Figure 12:
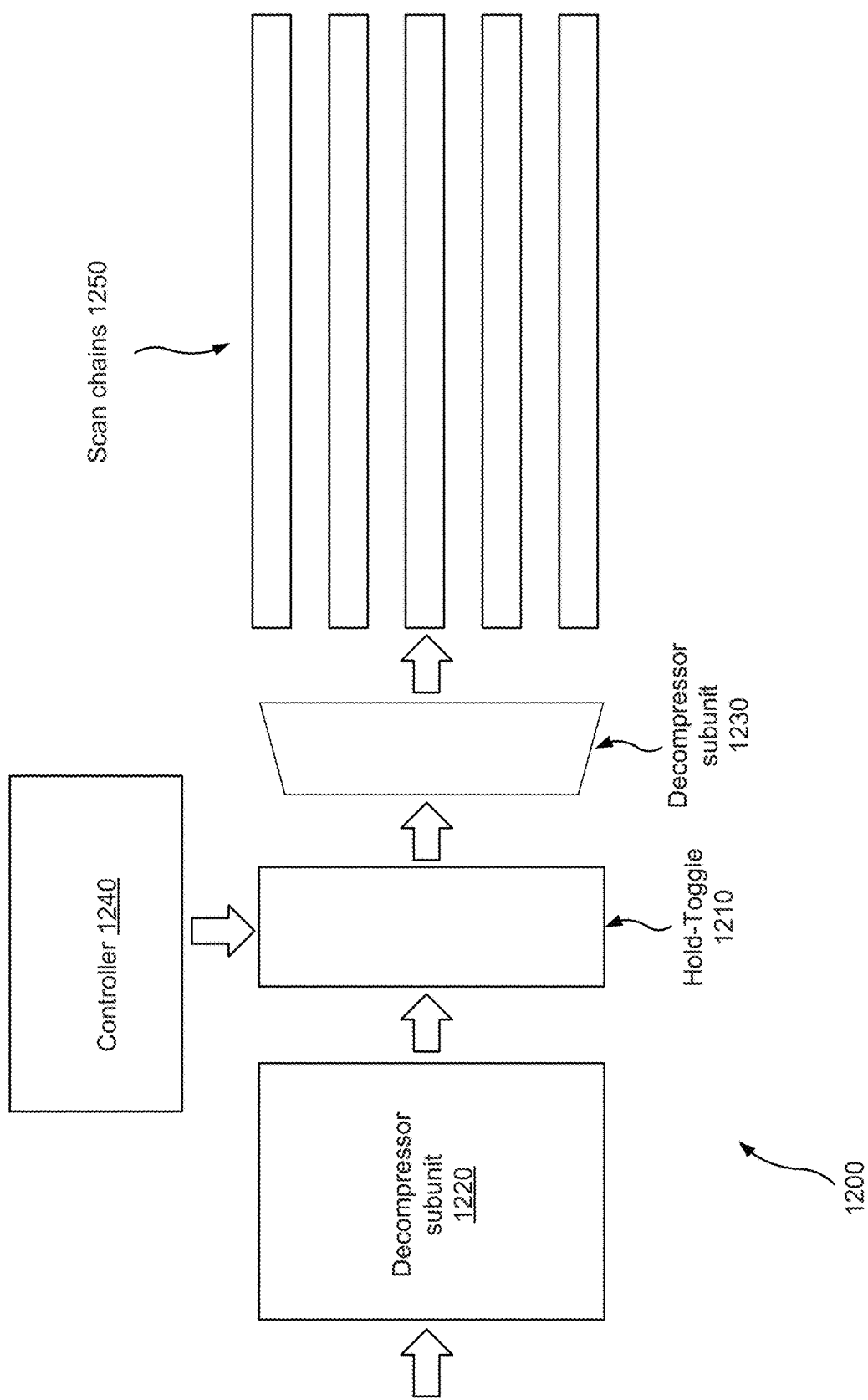
FIG. 12 illustrates an example of a test compression system in which hold-toggle circuitry is inserted into a decompressor according to some embodiments of the disclosed technology.
Figure 13:
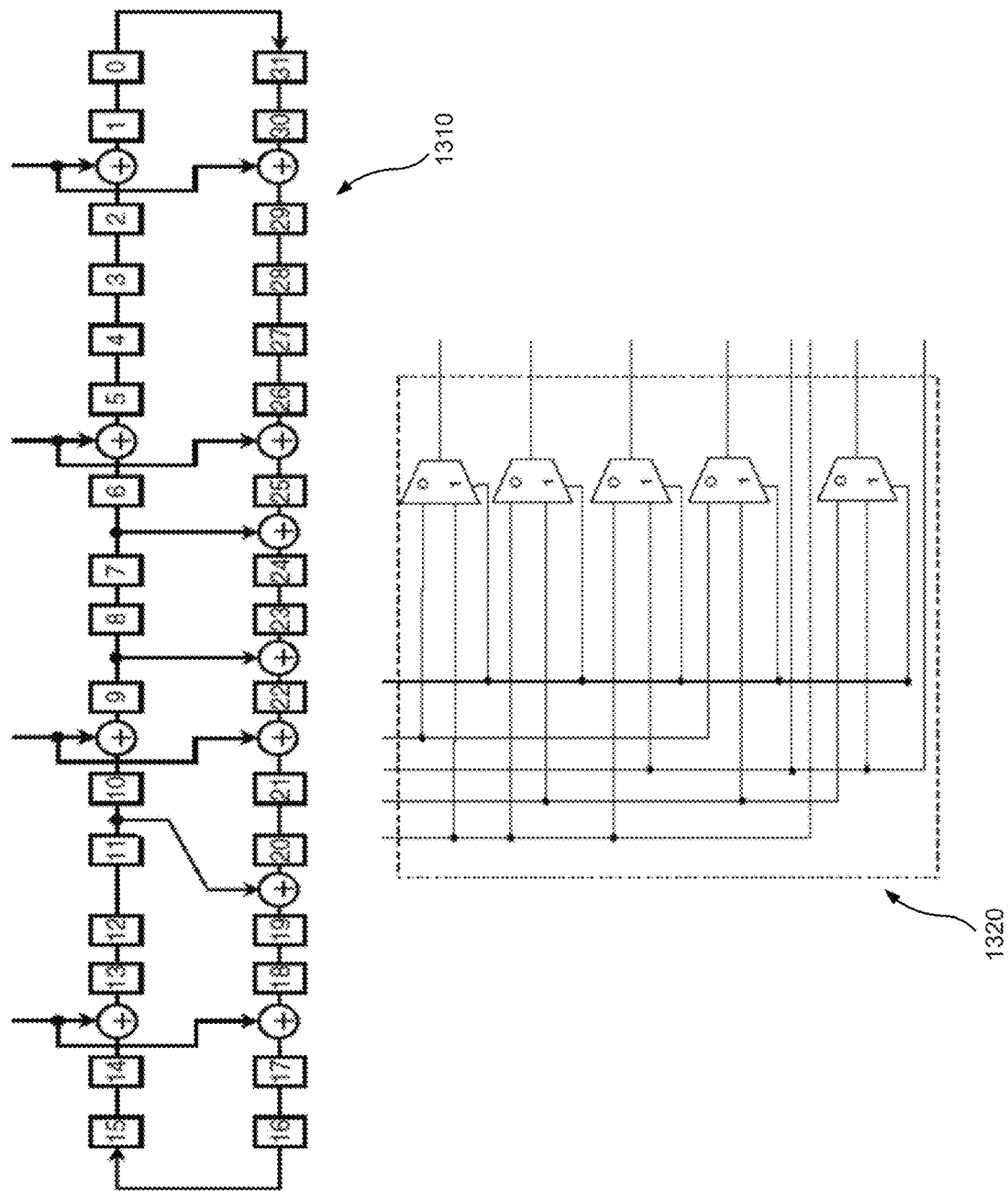
FIG. 13 illustrates an example of a ring generator and an example of a device comprising a plurality of multiplexers for broadcast-based decompression.

FIG. 12 illustrates an example of a system 1200 in which hold-toggle circuitry 1210, controlled by a controller 1240, is inserted into a decompressor. The decompressor comprises a decompressor subunit 1220 and a decompressor subunit 1230. The decompressor subunit 1230, coupled directly to scan chains 1250, may be an expander such as a phase shifter. An expander allows a limited input signal lines to feed a large number of scan chains. The decompressor subunit 1220 may be a ring generator for EDT-based decompression, an LFSR for LFSR-reseeding-based decompression, or a device comprising a plurality of multiplexers for broadcast-based decompression. FIG. 13 illustrates an example of a ring generator 1310 and an example of a device 1320 comprising a plurality of multiplexers for broadcast-based decompression.

Figure 14:
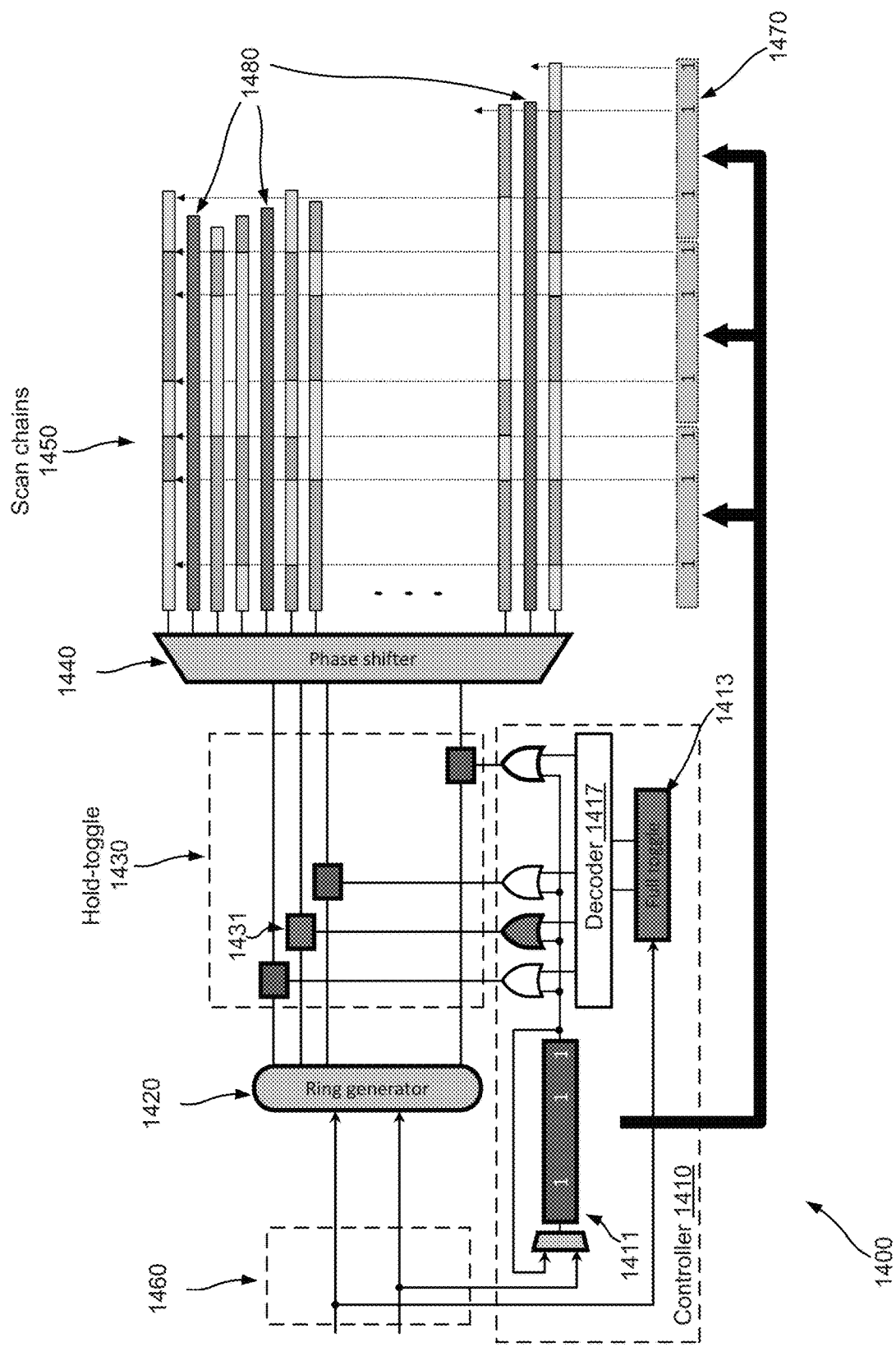
FIG. 14 illustrates an example of a block diagram of an EDT-based test compression system according to some embodiments of the disclosed technology

FIG. 14 illustrates an example of a block diagram of an EDT-based test compression system 1400 according to some embodiments of the disclosed technology. The EDT-based test compression system 1400 comprises scan chains 1450, a controller 1410, hold-toggle circuitry 1430, input circuitry

1460, and a decompressor comprising a ring generator 1420 and a phase shifter 1440. The ring generator 1420 may also be referred to as a continuous-flow ring generator. It can decode compressed test pattern data with every scan shift clock cycle. The phase shifter 1440 can mix and expand outputs of the ring generator 1420 to drive the scan chains 1450. In the EDT-based system 1400, the hold-toggle circuitry 1430 is inserted between the ring generator 1420 and the phase shifter 1440. The hold-toggle circuitry 1430 comprises subunits, of which each is coupled to an output of the ring generator 1420 and is controlled by a control signal bit outputted by the controller 1410. As noted previously, the subunit can be implemented by a latch with a multiplexer. Based on the control signal bit which may vary at some shift clock cycles, a subunit can either keep its content (hold) or be updated by the ring generator 1420 (toggle). A time point when the ring generator 1420 updates a subunit is called a toggle point. The controller 1410 comprises a circular shift register 1411 storing a hold-toggle pattern specifying the toggle points, a register 1413 storing operational mode information, and a decoder 1417 decoding the operational mode information. The outputs of the circular shift register 1411 and the decoder 1417 are combined by a set of OR gates to generate the control signal bits. The input circuitry 1460 may comprise switching circuitry which connects inputs to the controller 1410 when the input signals contain the hold-toggle pattern and/or the operational mode information or to the ring generator 1420 when the input signals contain a compressed test pattern.

As discussed previously, the small sizes of both the circular shift register 1411 and the register 1413 allow them to be updated frequently, even per pattern, without significantly affecting test time. For example, the input circuitry 1460 may comprise state elements. The hold-toggle pattern and/or the operational mode information may be combined with compressed test pattern bits. If the longest scan chain needs 500 clock cycles to be fully loaded, the next four clock cycles may be used to load the state elements in the input circuitry 1460 with the hold-toggle pattern and/or the operational mode information, which can then be transported to the controller 1410 for controlling the loading of the next test pattern. Here, less than 1% of the shift clock cycles are allocated to loading the controller 1460.

FIG. 14 also shows that a subunit 1431 in the hold-toggle circuitry 1430 is set to be "transparent"—allowing the corresponding output of the ring generator to feed the phase shifter 1440 directly, and that the other subunits update their contents according to toggle points specified by the hold-toggle pattern. As such, three scan chains 1480 operate in the full-toggle mode and the rest of the scan chains 1450 operate in the hold-toggle mode. Between two successive toggle points is a hold segment. Locations of all toggle points form a test template, of which a portion (1470) is illustrated in the figure. As can be seen, the hold-toggle pattern repeats three times in the portion of the test template 1470.

A system according to various embodiments of the disclosed technology can shift low-entropy (low-toggling) test patterns into scan chains. Experimental evidences derived using some implementations of the disclosed technology indicate that it typically suffices to have at most two hold latches in the hold-toggle circuitry of the system operating in a transparent mode. This means about a dozen or less scan chains operate in the full-toggle mode during scan shift. A large design typically has a couple of hundred or even a few thousand scan chains. As a result, a large portion of the scan chains receive low toggling bit sequences, and power dissipation can be significantly reduced when a test pattern is shifted into the scan chains.

Figure 15:
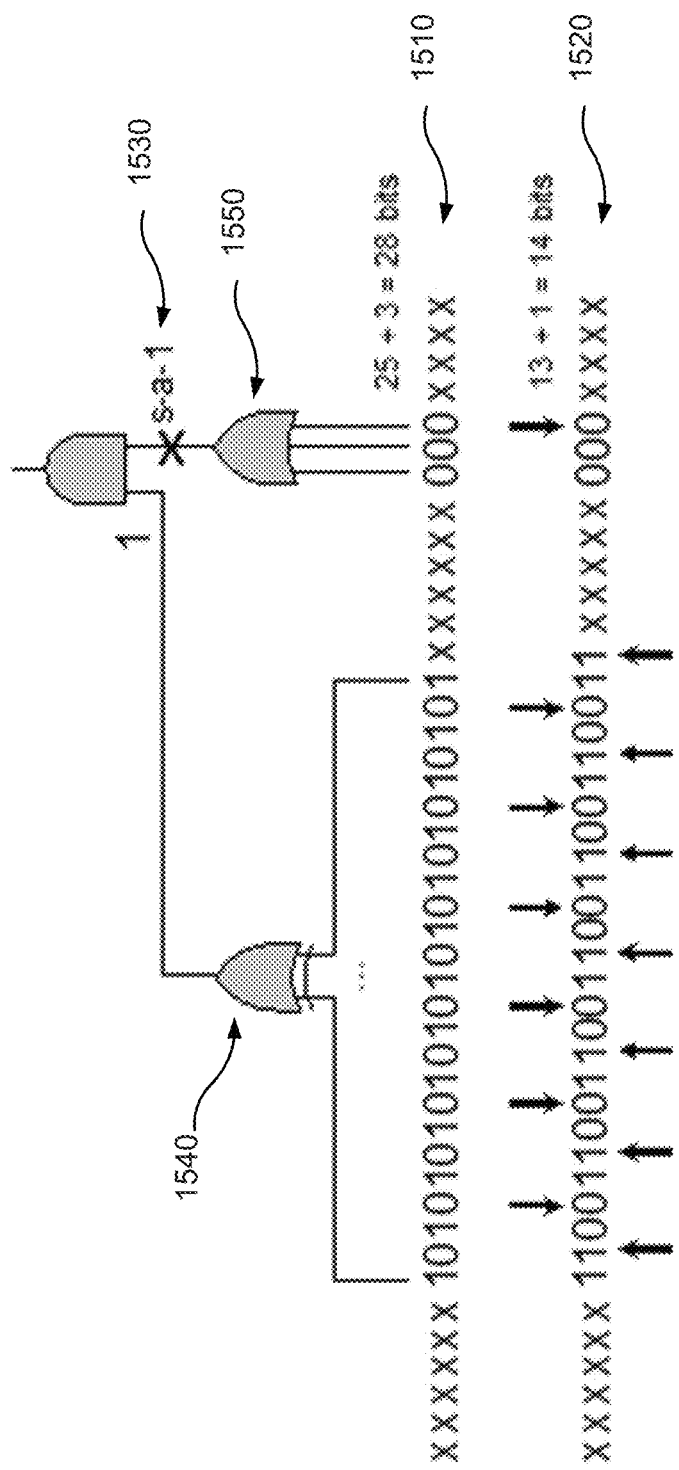
FIG. 15 illustrates an example of isomeric compression which may be implemented by various embodiments of the disclosed technology.

The disclosed technology can achieve high test compression even with low-entropy patterns. First, the number of care bits (specified bits) does not have to constrain neither compression nor a desired low toggling. On the contrary, having several cells assigned the same value and hosted by the same chain may actually ease problems related to both test data reduction and switching activity. Indeed, only specified bits occurring at certain locations would be then encoded in some of the compression schemes, while bits of the same value make it possible to deliver identical test data to scan chains for a number of shift cycles, thereby reducing the resultant toggling. FIG. 15 illustrates an example of isomeric compression which may be implemented by various embodiments of the disclosed technology. A test cube 1510 detects a stuck-at-1 fault 1530 by feeding a 25-input XOR gate 1540 and a 3-input OR gate 1550. Alternatively, one can apply a test cube 1520. The number of specified bits that have to be encoded within the test cube 1510 is equal to 25+3=28, whereas it suffices to target only 13+1=14 care bits to encode the test cube 1520. Here, the specified pairs "00" and "11" can be obtained by encoding just the first value of each pair (indicated by arrows) and then sustaining the decompressor outputs to deliver the identical value during the next shift cycle.

As mentioned early, two new features of the disclosed technology further help to obtain a high degree of test compression. First, a small set of scan chains receive a full toggle stimulus, and a different test patterns can dynamically select different sets of full toggle scan chains. This prevents scenarios where certain faults escape detection (leading to a coverage drop) because they need more frequent changes in a given scan chain than the hold-toggle mode could permit. Second, a short hold-toggle pattern repeating multiple times, rather than a full length hold-toggle template, is employed to control scan chains operating in the hold-toggle mode. In many cases, the short hold-toggle pattern can be less than 32 bits. Because of its size, a hold-toggle pattern can be deployed for any number of test patterns, including a single vector. This is because an update of a small test template register requires no additional patterns and/or ATE channels, and time needed to do this is a negligible fraction of a regular test pattern upload period. The dynamically changeable hold-toggle pattern makes ATPG and/or encoding more flexible and thus high compression feasible.

The disclosed technology can also achieve the benefits of low shift-power and high compression without significantly increasing test logic silicon real estate. As shown above, test logic (HTL) according to some embodiments of the disclosed technology can be implemented using one hold latch and one 3-input OR gate per a single bit of a ring generator. Furthermore, it comprises a template register, typically a 32-bit or smaller device, two login-bit full toggle registers, where n is the number of scan chains, and two 1-out-of-n decoders using a certain number (depending on n) of 5-input AND gates and inverters. FIG. 16 shows a table of the silicon real estate taken up by HTL in terms of equivalent area of 2-input NAND gates (measured also in $mm^2$) for 4 industrial circuits (C1-C4). The presented numbers are computed with a commercial synthesis tool for four industrial circuits. All components of the test logic are synthesized using a 65 nm CMOS standard cell library under 2.5 ns timing constraint. The table reports the following quantities: the resultant silicon area with respect to combinational and sequential devices for conventional scan-based designs (the first three columns), the total area taken by circuits with on-chip EDT-based test compression, and then the percentage area increase (ΔE). Subsequently, the total HTL-based area is presented and compared with the corresponding area occupied by conventional scan-based designs (ΔH). The results do not account for a routing cost, however. Except for two signals to control template and full toggle registers, it remains similar to that of the conventional scan. As can be seen, the resultant area is comparable to other scan-based DFT methods. Testing with power constraints typically needs additional hardware for: activating a high-speed scan enable signal, moderating di/dt through a scan burst capability, gating scan cells to reduce power dissipation during shift, and gating scan out signal to reduce the power consumption during normal operations. Having the HTL logic on a chip may result in slightly more complicated designs with respect to the placement and routing, but, in turn, the disclosed technology can further reduce test data volume and power consumption, allowing for more efficient handling of new types of defects.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. A system for testing a circuit, comprising:
scan chains comprising scan cells, the scan chains configured, in a test mode, to shift in test patterns, apply the test patterns to the circuit, capture test responses of the circuit, and shift out the test responses;
a controller comprising first storage circuitry, second storage circuitry, and a control signal generator, the first storage circuitry comprising circuitry configured to store operational mode information, the second storage circuitry comprising circuitry configured to store information of a hold-toggle pattern, and the control signal generator configured to generate a control signal based on the operational mode information and the hold-toggle pattern, wherein the operational mode information determines whether a scan chain operates in a full-toggle mode or in a hold-toggle mode during a shift period, the hold-toggle pattern determines in which shift clock cycles in a segment of consecutive shift clock cycles scan chains operating in the hold-toggle mode receive bits based on corresponding bits of a test pattern during the shift period, and the hold-toggle pattern repeats multiple times during the shift period, the shift period being a period when the test pattern is being shifted into the scan chains; and
hold-toggle circuitry coupled to the controller and configured to allow, according to the control signal, some scan chains in the scan chains to operate in the full-toggle mode and some other scan chains in the scan chains to operate in the hold-toggle mode during the shift period.

2. The system recited in claim 1, further comprising:
a decompressor, outputs of the hold-toggle circuitry being coupled to inputs of the decompressor or inputs of an expander in the decompressor.

3. The system recited in claim 2, wherein the decompressor comprises a ring generator and the expander is a phase shifter.

4. The system recited in claim 1, wherein the hold-toggle circuitry comprises a plurality of subunits, each of the plurality of subunits being controlled by a bit of the control signal.

5. The system recited in claim 1, wherein the second storage circuitry comprises a circular shift register.

6. The system recited in claim 5, wherein the circular shift register has 32 or fewer than 32 bits.

7. The system recited in claim 1, wherein the first storage circuitry comprises one or two pairs of register and decoder.

8. The system recited in claim 7, wherein the decoder is a one-hot decoder.

9. The system recited in claim 1, wherein the control signal generator comprises a plurality of subunits, each subunit combining an output of the second storage circuitry with one or more outputs of the first storage circuitry.

10. The system recited in claim 9, wherein the plurality of subunits are OR gates.

11. One or more non-transitory computer-readable media storing computer-executable instructions for causing a computer to perform a method, the method comprising:
creating a system in a circuit design for testing a circuit fabricated according to the circuit design, the system comprising:
scan chains comprising scan cells, the scan chains configured, in a test mode, to shift in test patterns, apply the test patterns to the circuit, capture test responses of the circuit, and shift out the test responses;
a controller comprising first storage circuitry, second storage circuitry, and a control signal generator, the first storage circuitry comprising circuitry configured to store operational mode information, the second storage circuitry comprising circuitry configured to store information of a hold-toggle pattern, and the control signal generator configured to generate a control signal based on the operational mode information and the hold-toggle pattern, wherein the operational mode information determines whether a scan chain operates in a full-toggle mode or in a hold-toggle mode during a shift period, the hold-toggle pattern determines in which shift clock cycles in a segment of consecutive shift clock cycles scan chains operating in the hold-toggle mode receive bits based on corresponding bits of a test pattern during the shift period, and the hold-toggle pattern repeats multiple times during the shift period, the shift period being a period when the test pattern is being shifted into the scan chains; and
hold-toggle circuitry coupled to the controller and configured to allow, according to the control signal, some scan chains in the scan chains to operate in the full-toggle mode and some other scan chains in the scan chains to operate in the hold-toggle mode during the shift period.

12. The one or more non-transitory computer-readable media recited in claim 11, wherein the system further comprises:
a decompressor, outputs of the hold-toggle circuitry being coupled to inputs of the decompressor or inputs of an expander in the decompressor.

13. The one or more non-transitory computer-readable media recited in claim 12, wherein the decompressor comprises a ring generator and the expander is a phase shifter.

14. The one or more non-transitory computer-readable media recited in claim 11, wherein the hold-toggle circuitry comprises a plurality of subunits, each of the plurality of subunits being controlled by a bit of the control signal.

15. The one or more non-transitory computer-readable media recited in claim 11, wherein the second storage circuitry comprises a circular shift register.

16. The one or more non-transitory computer-readable media recited in claim 15, wherein the circular shift register has 32 or fewer than 32 bits.

17. The one or more non-transitory computer-readable media recited in claim 11, wherein the first storage circuitry comprises one or two pairs of register and decoder.

18. The one or more non-transitory computer-readable media recited in claim 17, wherein the decoder is a one-hot decoder.

19. The one or more non-transitory computer-readable media recited in claim 11, wherein the control signal generator comprises a plurality of subunits, each subunit combining an output of the second storage circuitry with one or more outputs of the first storage circuitry.

20. The one or more non-transitory computer-readable media recited in claim 19, wherein the plurality of subunits are OR gates.

\* \* \* \* \*